United States Patent [19]

Morikawa et al.

[11] Patent Number: 4,587,201

[45] Date of Patent: May 6, 1986

[54] PHOTO-CURABLE URETHANE-ACRYLATE RESIN COMPOSITION FOR PERMANENT RESIST

[75] Inventors: Takao Morikawa, Tougane; Tosio Kobayasi; Masayuki Kataoka, both of Ichihara; Atsushi Mori, Chiba, all of Japan

[73] Assignee: Nippon Soda Co. Ltd., Tokyo, Japan

[21] Appl. No.: 736,522

[22] Filed: May 20, 1985

Related U.S. Application Data

[63] Continuation of Ser. No. 544,535, Oct. 24, 1983, abandoned.

[30] Foreign Application Priority Data

Nov. 5, 1982 [JP] Japan ................................. 57-193521

[51] Int. Cl.$^4$ ................................................ G03C 1/68
[52] U.S. Cl. .................................. 430/284; 430/286; 430/288; 522/90; 528/75
[58] Field of Search ...................... 430/284, 286, 288; 528/75; 204/159.19

[56] References Cited

U.S. PATENT DOCUMENTS

| | | | |
|---|---|---|---|
| 3,850,770 | 11/1974 | Juna et al. | 430/284 |
| 3,864,133 | 2/1975 | Hismatsu et al. | 430/284 |
| 4,003,751 | 1/1977 | Carder | 430/284 |
| 4,192,684 | 3/1980 | Gensho et al. | 430/284 |
| 4,216,267 | 8/1980 | Lerenz et al. | 430/284 |
| 4,250,248 | 2/1981 | Fausi | 430/284 |
| 4,283,480 | 8/1981 | Davies et al. | 430/284 |

*Primary Examiner*—Jack P. Brammer
*Attorney, Agent, or Firm*—George B. Oujevolk

[57] ABSTRACT

A photo-curable resin composition which comprises mixing urethane-acrylate resin [I], which is obtained by reacting components A and B, i.e., Component-A: Polyisocyanates containing polybutadiene with Component-B: Acrylate or methacrylate having a hydroxyl group in the molecule thereof and a photopolymerization initiator [II].

The cured composition is suitable as an additive plating resist in the manufacture of electronic circuitry.

2 Claims, No Drawings

PHOTO-CURABLE URETHANE-ACRYLATE RESIN COMPOSITION FOR PERMANENT RESIST

This application is a continuation of Ser. No. 544,535, filed Oct. 24, 1983 now abandoned.

DETAILED EXPLANATION OF THE INVENTION

This invention relates to a novel photo-curable resin composition for a permanent resist material.

In general, there are many methods used for manufacturing printed circuit boards; the subtractive method, the semi-additive method, the full-additive method and the like. Resists having a wide variety of characteristics have been developed as useful manufacturing materials. Of these methods, in the full-additive method, for instance, after drilling the required holes on an insulated substrate and activating treatment for electroless plating, those parts where no wiring pattern is formed are covered by resist and then, the wiring pattern is formed by means of electroless plating. In this case, the resist remains and becomes an important component as an insulating material of the circuit board.

In view of above, stability against various chemicals used in the electroless plating process, soldering resistance in the solder bath, various characteristics as a wiring insulator, adhesion property to substrates, etc. are needed for the resist material, hereinafter referred to merely as "resist" used in the full-additive method and it is also necessary for the resist to have high level characteristics for both short and long periods. This type of resist is generally referred to as the permanent resist.

Although research and development have been so far made as regards permanent resist, resist that fully satisfies the foregoing characteristics has not yet been obtained. The present inventors, as a result of their examinations and efforts to provide photo-curable composition for the said permanent resist that is used as a resist for the full-additive method, have found that it would be possible to obtain a resist having the foregoing characteristics with excellent chemical and physical, electrical and photosensitivity characteristics by using urethane-acrylate resin which is composed of polybutadiene polymer suitable for their purposes.

Generally speaking, this invention contemplates a photo-curable resin composition for permanent resist which comprises a mixed urethane-acrylate resin [I], which is obtained by reacting Component-A: Polyisocyanates obtained through reacting 0.8–1.2 mol of "Urethane prepolymer (a)" as hereinafter defined against 1.0 equivalent of hydroxyl group of "Polybutadienepolyols or a mixture thereof with organic hydroxy compounds (b)" as hereinafter defined with
Component-B: Acrylate or methacrylate having hydroxyl group in the molecule thereof, and
Photopolymerization initiator [II].

"Urethane prepolymers (a)" which are obtained through reacting 0.8–1.2 mol of diisocyanate compound against 1.0 equivalent of active hydrogen of multifunctional compounds.
"Polybutadienepolyols or a mixture thereof with organic hydroxy compounds (b)" which are polybutadienepolyols having 500–5,000 of number average molecular weight, 1,2-bond in a range of 50% or more of the butadiene unit in polymer chain and hydroxyl groups at both ends of the polymer chain or a mixture of said polybutadienepolyols and organic hydroxy compounds having 2 or more of hydroxyl group in a molecule thereof.

The further detailed description of this invention is provided in the following.

"Urethane prepolymer (a)" in producing polyisocyanates of component-A used in this invention is obtained through reaction of multifunctional compounds containing plural functional groups having active hydrogen with diisocyanate compound. Each of diisocyanates in a broad range of kinds is used independently or as an isomer mixture or as a mixture of different diisocyanates. As useful diisocyanates, the following compounds are enumerated:

2,4-toluylene diisocyanate, 2,6-toluylene diisocyanate, 4-methoxy-1,3-phenylene diisocyanate, 4-methoxy-1,3-phenylene diisocyanate, 4-isopropyl-1,3-phenylene diisocyanate, 4-chloro-1,3-phenylene diisocyanate, 4-butoxy-1,3-phenylene diisocyanate, 2,4-diisocyanate-diphenyl-ether, mesitylene diisocyanate, 4,4'-methylene bis(phenyl isocyanate), 1,5-naphthalene diisocyanate, benzene diisocyanate, O-nitro-benzene diisocyanate, 4,4'-diisocyanate dibenzyl, 1,4-tetramethylene diisocyanate, 1,6-hexamethylene diisocyanate, 1,10-decamethylene diisocyanate, 1,4-cyclohexylene diisocyanate, xylylene diisocyanate, 4,4'-methylene bis(cyclohexyl isocyanate) and 1,5-tetrahydronaphthalene diisocyanate. Representative diisocyanate is an isomer mixture of 2,4-toluylene diisocyanate 80% and 2,6-toluylene diisocyanate.

Further, as multifunctional compounds having a plurality of functional groups, preferably, 3 to 4 groups, containing active hydrogen for reaction with these diisocyanate compounds, those compounds having a molecular weight of 200 or less, for instance, glycerin, 1,2,6-hexane triol, 1,1,1-trimethylolpropane, 1,1,1-trimethylolethane, triethanolamine, triisopropanolamine and pentaerythritol are usually used. One kind or a mixture of 2 or more kinds of these compounds, when necessary, can be used.

Further, in "Polybutadienepolyols or mixture thereof with organic hydroxy compounds (b)", one example of the most suited manufacturing method of butadiene polymer; that is, so-called butadienepolyols which has hydroxyl groups at both ends of the polymer chain is as follows. When a polymerization reaction solution produced by adding butadiene to a Lewis base compound such as tetrahydrofuran and to a compound containing such alkali metals as lithium, sodium, etc. under existence or non-existence of such aromatic hydrocarbon activators as naphthalene, 1,2-diphenyl benzene, etc. is treated with such alkylene oxide as ethylene oxide, propylene oxide, etc. or is treated with a reagent containing active hydrogen after oxidation such as water, methanol, etc., butadiene polymer containing hydroxyl groups at the ends of the polymer chain is obtained and further, when polymerization reaction solution, which is produced by mixing butadiene and monomer such as isobutylene, styrene, etc. with or gradually adding to the aforementioned compound, is treated with alkylene oxide such as ethylene oxide, propylene oxide, etc. or treated with a reagent containing active hydrogen after oxidation thereof, a butadiene copolymer containing hydroxyl groups at the ends of polymer chain is obtained.

As comonomer used as the butadiene copolymer in the aforementioned treatment, such vinyl monomers as styrene, α-methyl styrene, acrylic ester, methacrylic ester, methyl vinyl ketone, etc. are used.

In addition, graft butadiene copolymer obtained through reaction of the aforementioned butadiene polymer and such vinyl monomers as α-methyl styrene, acrylonitrile, acryic ester, methacrylic ester and methyl vinyl ketone, or butadiene polymer derivatives such as epoxide polybutadiene polymer, etc. which are obtained by treating the aforementioned butadiene polymer with peroxy acid can be used in this invention as polybutadienepolyols. 80% or more of butadiene unit of polymer chain or 95% or more, depending upon reaction conditions, of polybutadienepolyols thus obtained are in 1,2-bond, and hydroxyl groups exist mainly at both ends of the polymer chain, including those containing hydroxyl groups at one end only but excluding those containing 3 or more hydroxyl groups. Therefore, the product obtained from a reaction with "Urethane prepolymer (a)" containing a free isocyanate group mainly consists of a straight chain polymer and has low viscosity and excellent storage stability.

The reasons for the molecular weight of the polybutadienepolyols used in this invention being set at a 500-5,000 is because the aimed effect is hardly obtained at molecular weight under 500 as the butadiene chain is too short and on the other hand, workability is not satisfactory at a weight above 5.000 as the viscosity is high. It is important that the number of hydroxyl groups is normally 2-2.5 groups per molecule and the partial existence of a molecule containing one hydroxyl group may be allowed but if many hydroxyl groups are contained in one molecule, increase in viscosity or gelation is the result and not desirable for production as well as storage. Further, existence of hydroxyl groups at both ends of polymer chain is an important factor to indicate flexibility and excellent impact resistance of the desired product.

Further, the polybutadienepolyols used in this invention features that 50% or more of the butadiene units constituting the main chain structure have a 1,2-bond, and intermolecular cross linking is made very easily by the excellent reactivity of the branched vinyl groups based on the 1,2-bond, and sufficient effect cannot be obtained if the number of units with the 1,2-bond rate is low. In particular, when polybutadienepolyols with 80% or more of 1.2-bond are used, a resist, which is the final product, with more excellent curing characteristic and hardness is obtained.

As organic hydroxy compounds in (b) containing 2 or more hydroxyl groups per molecule and used in this invention by partially mixing with polybutadienepolyols, there are polyetherpolyols, polyesterpolyols, polyacrylpolyols, etc. These compounds are used at a mixing ratio of 60% or more of polybutadiene polyol.

Representative polyetherpolyoles are obtained through polymerization of alkylene oxide; e.g., polyethylene glycol, polypropylene glycol, etc. of molecular weight 200-5,000. Further neopenthyl glycol, 1,6-hexanediole, etc. are exampled as alkylene glycol.

Polyisocyanates of component-A used in this invention is produced in the method hereinafter shown.

In the presence of an inactive solvent, the aforementioned multifunctional compounds having plural functional groups containing active hydrogen are reacted with diisocyanate at a ratio about 1.0 mol of diisocyanate against 1.0 equivalent of active hydrogen of multifunctional compounds under normal temperature or by heating, with a urethane reaction catalyst added when necessary to produce "Urethane-prepolymer (a)". Then, this "Urethane prepolymers (a)" is reacted with "polybutadienepolyols or a mixture thereof with such organic hydroxy compounds (b)" as polyetherpolyols, polyesterpolyols, polyacrylpolyols, at a ratio of about 1.0 mol of "Urethane-prepolymers (a)" against 1.0 equivalent of hydroxyl group of "polybutadienepolyols or a mixture thereof with organic hydroxy compounds (b)". The polyisocyanates component-A is thus produced.

For the inactive solvent used in the aforementioned reaction, hydrocarbon, ester, ketone, ether, hydrocarbon halide and their mixture containing no active hydrogen reacting with isocyanate group are used.

A solvent to be used in the said reaction is freely selected by considering the boiling point, freezing point, volatility, solubility and price according to the application. Aromatic hydrocarbons such as benzene, toluene, xylene, etc., aliphatic hydrocarbons such as kelosene, mineral spirit, etc., esters such as ethyl acetate, butyl acetate, etc., ethers such as methyl cellosolve acetate, etc. aliphatic hydrocarbon halides such as carbon tetrachloride, 1,1,1-trichloroethane, perchloroethylene, etc. and aromatic hydrocarbon halides such as chlorobenzene, O-dichlorobenzene, etc. are used independently or as a mixture. The quantity to be used is usually determined as appropriate by taking the viscosity of the reaction products, etc. into consideration within a range of 0.3 to 10 times of polybutadienepolyols or multifunctional compounds having plural functional groups containing active hydrogen, but a desirable quantity is from 0.5 to 2.0 times of a compound used in the reaction. If the quantity of the solvent is too much, the reaction is delayed, leaving free diisocyanate.

The "Urethane prepolymers (a)" producing reaction is usually performed at 25°-100° C. for at least 30 min. Generally, it is desirable to have the reaction at 80° C. for approximately 2 hours. The lower the reaction temperature, the longer the reaction time is required. Further, at a temperature than 100° C., product with inadequate higher viscosity is produced.

As to the quantity ratio between multifunctional compounds having plural functional groups containing active hydrogen and diisocyanate in the "Urethane prepolymer (a)" production, taking workability, drying characteristic and other characteristics into consideration, a ratio 0.8-1.2 mol of diisocyanate compound against 1.0 equivalent of active hydrogen of multifunctional compounds is used, and preferably 1.0 mol of diisocyanate. The prepolymer thus obtained contains the same number of isocyanate groups as the number of active hydrogens contained in a multifunctional compounds having functional groups.

The quantity of the "Urethane prepolymer (a)" which is to be reacted with 1.0 equivalent of the hydroxyl group contained in "Polybutadienepolyols or a mixture thereof with such organic hydroxy compounds (b)" as polyetherpolyols, polyesterpolyols, polyacrylpolyols is 0.8-1.2 mol, but 0.9-1.0 mol is preferable. When the quantity of "Polybutadienepolyols or a mixture thereof with organic hydroxyl compounds (b)" increases, the viscosity increased and further, gelation may result. On the other hand, when it's quantity decreases, mechanical strength and features in chemical properties of the resist desired by this invention may be lost.

The reaction of "Polybutadienepolyols or a mixture thereof with organic hydroxy compounds (b)" and "Urethane prepolymer" is usually performed at 25°–100° C. for at least 30 minutes, but it is preferable to perform the reaction at 80° C. for 4 hours.

The urethane-acrylate resin (1) used in this invention is obtained by reacting polyisocyanates component-A obtained as described with acrylate or methacrylate having hydroxyl groups, that is, component-B.

As acrylate or methacrylate having hydroxyl groups, there are 2-hydroxyethylmethacrylate, 2-hydroxyethylacrylate, 3-chloro-2-hydroxypropylacrylate, 3-butoxy-2-hydroxypropylacrylate, 3-methoxy-2-hydroxypropylmethacrylate, 2-hydroxypentylacrylate, 2-hydroxypenthylmethacrylate, etc.

The reaction of the said polyisocyanates component-A with acrylate or methacrylate component-B containing hydroxyl groups is usually performed at 25°–100° C. for at least 30 minutes but it is desirable to react them at 80° C. for approximately 4 hours. In addition, for preventing gelation and increase in viscosity increase it is desirable to let them react in a reactor while blowing air into the reactor. Further, the ratio of the hydroxyl groups in the acrylate or methacrylate of component-B as compared with the isocyanate groups in the said polyisocyanates of component-A is 0.8–1.5 equivalent of the hydroxyl group in component-B against 1.0 equivalent of the isocyanate group in component-A, and preferably the equivalent is 0.9–1.2. If the ratio is below 0.8 equivalent, the photo-curing property of the resin drops, while, if it is above 1.5 equivalent, the characteristics of the cured resin also drops.

As a photopolymerization initiator [II] used in this invention, there are carbonyl compounds, peroxides, sulfur contaning compounds, halogen containing compounds, inorganic compounds, polynucleus quinone compounds and azo compounds. These compounds are those usually used in general photopolymerization.

As carbonyl compounds, diacethyl, benzoin, benzophenone, acetone, butyroin, benzoinm ethyl ether, benzoin ethyl ether, benzoin isopropyl ether, anisoin ethyl ether, pivaloin ethyl ether, benzyl dimethyl ketal, α-alkylbenzoins (e.g., α-benzyl benzoin), benzaldehyde and acetophenone are enumerated.

As peroxides, there are such aliphatic diamylperoxides as hydrogen peroxide, octanoyldiamylperoxide, lauroylamylperoxide, such aromatic peroxides as benzoylperoxide, tertiary butylperoxybenzoate and diisopropyl-peroxycarbonate, such hydroperoxides as tertiary butylhydroperoxide and cumene hydroperoxide, such ester peroxides as tertiary butylperoxy-2-ethylhexanoate and tertiary butylperoxylaurate, and such dialkyl peroxides as di-tertiary butylperoxide and dicumyl peroxide.

As sulfur containing compounds, there are thiazines (e.g., phenothiazine), sulfinic acid, mercaptans, tetraethylthiuram disulfide, decyl allyl sulfide, diphenyldisulfide, diphenylsulfide, benzoylsulfide, dibenzothiazolesulfide, 4,4'-dimethylphenyldisulfide, 2,2',5,5'-tetramethyldiphenyl disulfide and aryldithiocarbamate deriviate (e.q., benzodithiocarbamate).

As halogen containing compounds, there are bromine, iodine, carbon tetrachloride, chloroform, acrolein dibromide, bromoacetophenone, chloroacetone and bromoisovalerophenon.

As inorganic compounds, there are such inorganic carbonyl compounds as manganese carbonyl, dirhenium dicarbonyl, such silver compounds as silver nitrate, silver iodide, silver chlorate, silver oxalate and silver bichromate, such mercury compounds as diethyl mercury, methyl chloride mercury, such tin compounds as tin chloride (e.g. $SnCl_4$, $SnCl_2$) and tin sulfate, such cerium compounds as cerous carbonate, ceric ammonium sulfate and cerium perchlorate, such iron compounds as ferric citrate, ferric oxalate, ferric perchlorate, ferric ferricyanide and ferric sulfaminate.

As polynucleus quinone compounds, there are camphorquinone, 1,4-naphthoquinone, 9,10-anthraquinone, 2-methylanthraquinone, and 7,8,9,10-tetrahydronaphthenequinone.

As azo compounds, there are hexafluoroazomethane,2,2'-azobispropane acetone cyahydrorine, azobisisobutyronitrile, benzanthrone, α-azobis-1-cyclohexane carbonitrile, azoiso-butylamide, diazonium salt, azoxy compounds (e.g., m.m'-azoxystyrene), m- or p-isocyanate benzen sulfamide, and benzendiazonium salt.

As coloring matters, Methylene Blue, Eosin, riboflavine, chlorophyll, fluorescein, acridine compounds (e.g., 3,6-diaminoacridiene) and cyanine compounds (e.g., cryptocyanine) are enumerated.

The aforementioned photopolymerization initiators can be used independently or two or more initiators may be used together, the quantity of phototopolymerization initiator usually added is 0.05–10% by weight of urethane-acrylate resin, preferably 0.1–5% by weight on the same basis. In addition, these initiators may be introduced into the structure of the basic resin through chemical combination.

Further, in this invention radical plymerization monomer can be blended as a polymerization diluent as necessary. As this monomer, those that contain two or more acryloyl group or methacryloyl group in a molecule; for example, such diester of acrylic acid or methacrylic acid as ethylene glycol diacrylate, ethylene glycol dimetacrylate, trimethylol propane triacrylate, trimethylol ethane triacrylate, pentaerythritol tetraacrylate, etc. are enumerated.

Further, acrylate acid and methacrylic acid esters with adduct of alkylene oxide and bisphenol A; e.g., 2,2-bis(4-acryloxy ethoxy phenyl)propane, 2,2-bis(4-methacryloxy ethoxy phenyl)propane and compounds obtained through reaction of such a compound containing at least 2 epoxy groups as alicyclic epoxy resin or bisphenol A-epichlorohydrin type epoxy resin with acrylic acid or methacrylic acid can be enumerated.

Since an image formed on an insulated plate may be visually inspected, it is desirable to color the resist to give it a good appearance. In view of this, it is better to color the lower layer resist and/or the upper layer resist composites.

The coloring can be made using pigment or dyestuff. Any pigment or dyestuff can be used but an image on the photo-cured part remaining after development must be colored. For this reason, a desirable pigment or dyestuff is such that it is hard to extract by a hydrocarbon halide such as 1,1,1-trichloroethane, which is a generally used in a development solution, and an insoluble pigment or dyestuff is best suited to this purpose. As examples of insoluble pigment or dyestuff, such azo compounds as C.I. Pigment Orange 14 (C.I. 21165) and C.I. Pigment Red 13 (C.I. 12395), such phthalocyanine compounds as C.I. Pigment Green 7 (C.I. 74260), such anthraquinone compounds as C.I. Pigment Blue 22 (C.I. 69810), C.I. Vat Orange 3 (C.I. 59300), etc., such perinone compounds as C.I. Vat Orange 7 (C.I. 71105), C.I. Vat Red 15 (C.I. 71100), etc. such indigoid compounds as C.I. Vat Violet 3 (C.I. 73395), such carbonium compounds as C.I. Pigment Red 81 (C.I. 45160) and such quinacridone compounds as C.I. Violet 19 (C.I. 46500) are enumerated.

In this invention, in order to prevent gelation resulting from polymerization during the storage period of the resist solution and the production process, a polymerization inhibitor can be used.

As polymerization inhibitors, there are such quinone compounds as p-benzoquinone, naphthoquinone, phenanthraquinone, p-xyloquinone, p-toluquinone, 2,6-dichloroquinone, 2,5-diphenyl-p-benzoquinone, etc. such polyhydric phenol compounds as hydroquinone, p-tertiary-butylcatechol, 2,5-di-tertiary-butylhydroquinone, tertiary-butylhydroquinone, 2,5-di-tertiary-hydroquinone, etc. such phenol compounds as p-methoxyphenol, α-naphthol, etc. such amidine compounds as acetamidineacetate, etc., such hydrazine salts as phenylhydrazine hydrochloride, hydrazine hydrochlorid etc., such quaternary ammonium salts as trimethylbenzyl ammonium chloride, lauryl pyridinium chloride, cetyl trimethyl ammonium chloride, phenyl trimethyl ammonium chloride, such amine compounds as phenyl-β-naphthylamine, and p-benzylaminophenol, such nitro compounds as dinitrobenzene and trinitrotoluene, and such oxime compounds as quinonedioxime and cyclohexanone oxime. Even under presence of these polymerization inhibitors, however, polymerization reaction by light (ultraviolet ray) is not prevented.

In this invention, it is possible to blend other materials for improving the quality.

For instance, if it is necessary to make the resist non-combustible, a well-known flame retarder, flame-resisting assistant, thixotropic additive for regulating viscosity or printability, coupling agent for improving moisture-resistance and adhesive property, body pigments such as aluminium hydroxide, barium hydroxide, etc. such modified resins and thermoplastic resin as petroleum resin, ketone resin, terpene resin, etc. are used.

The resist of this invention can be used by directly coating it on a substrate by means of a roller coater and other coating equipment and by scattering solvent to form coating film to a thickness of 10–100 μm after dried, or by coating resist solution on an appropriate filmy supporting substance and scattering solvent over it to form a dried coating film, which is then transferred on a substrate by means of a laminater, etc. to form a resist film on the substrate.

Further, the application of the photo-curable resin composition of this invention is not limited only to permanent resist but, making the most of excellent chemical and physical resisting characteristic, electrical characteristic, photosensitivity characteristic, etc. retained by the said resin composition, it can be applied to other circuit forming processes and used as various resist materials in metal processing and relief, stencil plate and semiconductor manufacturing, or protective coating material for circuit boards, electric and electronic parts and laser disk, or painting and coating material for metal, plastic, glass, wood, etc. and other applications.

For the purpose of giving those skilled in the art a better understanding of the invention, the following illustrative examples are given, wherein, unless otherwise indicated, parts and percentages are based on weight:

EXAMPLE I

With 240 parts of toluylene diisocyanate consisting of 2,4-toluylene diisocyanate 80% and 2,6-toluylene diisocyanate 20% and 60 parts of 1,1,1-trimethylol propane and 120 parts of n-butyl acetate was placed in a reaction vessel equipped with an agitator, nitrogen gas blowing tube, dropping funnel, thermometer and reflux condenser, after air in the reaction vessel was replaced by nitrogen gas, slowly heating the vessel while agitating these compounds to react at 80° C. for 2 hours.

Then, 470 parts of polybutadienepolyol, 91.7% of which butadiene unit in the polymer chain of average molecular weight of 2,000 and a hydroxyl value of 50 (KOHmg/g) are in 1,2-bond was placed in a mixed solvent of 370 parts of toluene, 90 parts of ethylene glycol monoethyl ether acetate and this solution was dropped in the reaction vessel for about 2 hours. After the dropping was completed, while flowing nitrogen gas into the reaction vessel, the reaction was continued at 80° C. for 2 hours. Polyisocyanate compound thus obtained was a light yellow and transparent solution containing 2.4% of free isocyanate and its viscosity was V (measured by a bubble viscometer at 20° C. Hereinafter, the same condition applies.)

Then, by changing over nitrogen gas to be blown to dry air, 116 parts of 2-hydroxyethylacrylate was dropped into the reaction vessel through the dropping funnel for 2 hours while blowing the dry air into the reaction vessel, and after the dropping was completed, the reaction was further continued at 80° C. for 3.5 hours. After the reaction solution was cooled to room temperature, 30 parts of benzyl dimethyl ketal, 3.0 parts of Michler's ketone, 0.5 parts of p-methoxyphenol and 0.5 parts of Victoria Pure Blue were added and well agitated to dissolve them, and the aimed photo-curable resin composition (C-1) was thus obtained.

EXAMPLE II

With 18.4 parts of glycerin, 104.5 parts of the same toluylene diisocyanate as those used in Example I, and 52.7 parts of n-butyl acetate placed in a reaction vessel similar to that in Example I, they were reacted at 60° C. for 3 hours. Then, 340 parts of polybutadienepolyol, 92.1% of which butadiene unit in polymer chain of average molecular weight 3,000 and hydroxyl value 30 was in 1,2-bond was dissolved in a mixed solvent of 200 parts of toluene, 70 parts of ethyl acetate, and 70 parts of ethylene glycol monomethyl ether acetate. This solution was then slowly dropped into the reaction vessel through the dropping funnel for about 2 hours and after kept at 75° C. for 3 hours in an atomosphere of nitrogen gas, the reaction was completed. Polyisocyanate compound thus produced has a 2.1% free isocyanate base concentration and viscosity J-K.

Then, by changing over nitrogen gas to be introduced into the reaction vessel to dry air, 55.7 parts of 2-hydroxyacrylate was dropped into the reaction vessel through the dropping funnel while blowing dry air into the reaction vessel little by little to react them as in Example I.

After the reaction was completed, the reacted solution was cooled to room temperature, added with a solution obtained by dissolving 51.4 parts of ketone resin (HIRAC 222, made by Hitachi Chemical Co., Ltd.) into 102 parts of methyl ethyl ketone, and further, 19.4 parts of benzyl dimethyl ketal, 5.0 parts of Michler's ketone and 0.14 parts of Victoria Pure Blue were added and well mixed, and photo-curable resin composition (C-2) was prepared.

EXAMPLE III

In a reaction vessel similar to that used in Example I were placed 26.8 parts of 1,2,6-hexanetriol, 104.5 parts of toluylene diisocyanate used in Example I and 69.7 parts of n-butyl acetate, they were reacted at 80° C. for 2 hours in an atmosphere of nitrogen gas.

Then, 97.2 parts of epoxide polybutadienepolyol of oxirane oxygen content 8.0%, average molecular weight 1.000 and hydroxyl value 105.0 was dissolved in a mixed solvent of 47.2 parts of toluene, 45.0 parts of ethyl acetate and 45.0 parts of ethylene glycol monomethyl ether acetate, and this solution was dropped into the reaction vessel through the dropping funnel, and after keeping this solution at 75° C. for 3 hours, the reaction was completed. The product obtained through this reaction was a light yellow transparent liquid having free isocyanate base concentration 4.45% and viscosity V at 20° C. (by a bubble viscometer).

Then, by changing over nitrogen gas to be introduced to dry air, 85.3 parts of 3-butoxy-2-hydroxypropylacrylate was dropped into this product through the dropping funnel for reaction while introducing dry air into the reaction vessel little by little. After the reaction, the reacted solution was cooled to room temperature and 19.7 parts of Quintone 1700 (made by Nihon Zeon Co., Ltd.) was added and well mixed to an uniform solution to which 8.0 parts of benzophenone, 2.0 parts of Michler's ketone and 0.1 parts of Victoria Pure Blue were added, and photo-curable resin composition (C-3) was prepared.

EXAMPLE IV

With 60 parts of 1,1,1-trimethylol propane, 240 parts of toluylene diisocyanate used in Example I, and 300 parts of n-butyl acetate placed in a reaction vessel similar to that used in Example I, after substituting nitrogen gas, this mixture was slowly heated at 80° C. for 2 hours while agitating for reaction.

Then, 175.4 parts of polybutadienepolyol, 91.7% of which the butadiene unit in the polymer chain with an average molecular weight 1,500 and a hydroxyl value of 66.6 has a 1,2-bond and 73.6 parts of polypropylene glycol of number average molecular weight of 700 were dissolved in 249 parts of n-butyl acetate. This mixture was dropped into the reaction vessel for about 2 hours. After the dropping was completed, this mixture was continuously reacted at 80° C. for 4 hours while introducing nitrogen gas into the reaction vessel little by little.

Then, changing over nitrogen gas to be introduced into the reaction vessel to dry air, 123 parts of 2-hydroxyethylacrylate was dropped into the reaction vessel for 2 hours while introducing dry air little by little and after the dropping was completed, the reaction was further continued at 80° C. for 3.5 hours.

After cooling this reacted solution to room temperature, 140 parts of Hi-rez G100X (made by Mitsui Petrochemical Co., Ltd., 50% n-butyl acetate solution), 30 parts of benzyl dimethyl ketal, 3.0 parts of Michler's Ketone, 0.5 parts of Victoria Pure Blue and 5.0 parts of P-methoxyphenol were added and well mixed. Photocurable resin composite (C-4) was thus prepared.

EXAMPLE V

With 60 parts of 1,1,1-trimethylol propane, 231.7 parts of hexamethylene diisocyanate and 291.7 parts of n-butyl acetate placed in a reaction vessel similar to that used in Example I, after substituting nitrogen gas, this mixture was slowly heated at 80° C. for 2 hours while agitating for reaction.

Then, 175.4 parts of polybutadienepolyol and 73.6 parts of polypropylene glycol used in Example IV were dissolved in 249 parts of n-butyl acetate.

This mixture was dropped into the reaction vessel for about 2 hours. After the dropping was completed, this mixture was continuously reacted at 80° C. for 4 hours while introducing nitrogen gas into the reaction vessel little by little.

Then, changing over nitrogen gas to be introduced into the reaction vessel to dry air, 123 parts of 2-hydroxyethylacrylate was dropped into the reaction vessel for 2 hours while introducing dry air little by little and after the dropping was completed, the reaction was further continued at 80° C. for 3.5 hours.

After cooling this reacted solution to room temperature, 140 parts of Hi-rez G100X (made by Mitsui Petrochemical Co., Ltd., 50% n-butyl acetate solution), 30 parts of benzyl dimethyl ketal, 3.0 parts of Michler's Ketone, 0.5 parts of Victoria Pure Blue and 5.0 parts of P-methoxyphenol was added and well mixed. Photocurable resin composite (C-5) was thus prepared.

The photo-curable resin compositions for permanent resist obtained through the preparations in Examples I–V were coated on epoxy-fiberglass laminated sheets (0.8 mm thick) which were processed for activation by the normal method for electroless plating using a roll coater so that thickness of the coated film of each laminated sheet become 20–30 $\mu$m. These epoxy-fiberglass laminated sheets were then dried by a hot air of 80° C. and the laminated sheets with a resist coating formed on one side were produced.

Then, a mask for pattern exposing was put on the resist film and exposed for 3 minutes by a 80 W/cm high-pressure mercury lamp from a distance of 30 cm. Thereafter, the development was made using a mixed solution of 1,1,2-trichloroethylene and 1,1,1-trichloroethane at a ratio of 1:1. As a result, a precision image corresponding to the mask was obtained. Further, tests of alkali resistance, trichloroethylene resistance, corrosion resistance, solder-thermal resistance and cooling and heating re-cycling resistance were conducted on this resist image. Furthermore, electrical characteristics of the photopolymerization cured substance of (C-1)-(C-5) obtained in the examples I–V were conducted. The test results are shown in Table-I.

TABLE I

| | Example No. | | | | |
| --- | --- | --- | --- | --- | --- |
| | Example I | Example II | Example III | Example IV | Example V |
| | | | Photo curable resin composition | | |
| Testing item | (C-1) | (C-2) | (C-3) | (C-4) | (C-5) |
| Resolving power (Note-1) | 100 $\mu$m ± 10 $\mu$m | 100 $\mu$m ± 10 $\mu$m | 100 $\mu$m ± 10 $\mu$m | 100 $\mu$m ± 10 $\mu$m | 100 $\mu$m ± 10$\mu$ |
| Alkali resistance (Note-2) | good | good | good | good | good |

TABLE I-continued

| | Example I | Example II | Example III | Example IV | Example V |
|---|---|---|---|---|---|
| | | | Photo curable resin composition | | |
| Testing item | (C-1) | (C-2) | (C-3) | (C-4) | (C-5) |
| Trichloroethylene resistance (Note-3) | good | good | good | good | good |
| Corrosion resistance (Note-4) | good | good | good | good | good |
| Solder-thermal resistance (Note-5) | good | good | good | good | good |
| Cooling and heating re-cycling test (Note-6) | good | good | good | good | good |
| Dielectric breakdown voltage (KV/mm) | 20 or more | 20 or more | 20 or more | 20 or more | 20 or more |
| Volume resistivity ($\Omega \cdot$ cm, 20° C.) | $10^{15}$ or more | $10^{15}$ or more | $10^{15}$ or more | $10^{15}$ or more | $10^{15}$ or more |

Note-1: accuracy for min. line width 100 μm on the whole surface of a substrate of 500 × 300 mm size.
Note-2: immersed in alkali solution (PH 12.5) at 70° C. for 20 hours.
Note-3: immersed in boiled tricloroethylene for 5 minutes.
Note-4: immersed in chromic acid mixture at 20° C. for 10 minutes.
Note-5: immersed in solder both at 260° C. for 30 seconds.
Note-6: from −60° C. to 120° C. for 30 cycles.

EXAMPLE VI

Using the unclad material epoxy-fiberglass substrate (500×30 mm, 1.6 mm thick), a throughhole was drilled with a NC drilling machine. The substrate was swelled in DMF and then, immersed in a mixed acid consisting of 300 g/l chromic acid and 200 cc/l sulfuric acid at 60° C. for 15 min. for surface roughing. After washing in water, the substrate was treated in HS-101B photo sensitizing agent (Hitachi Chemical Co., Ltd.) for 5 min. and then, after washing in water, it was immersed in Hitachi Chemical's accelerator for 2 min. After washing in water, it was dried at 120° C. for 30 min, and coated with photo-curable resin composition (C-4), which was used Example IV to a thickness of 30 μm using a curtain coater. After dried at 80° C. for 20 min., the same (C-4) was coated on the reverse side to a thickness of 30 μm, drying at 80° C. for 20 min., and a tack-free state photosensitive resist was obtained. Then, using the designated film mask, UV exposure was conducted at the same conditions as in Examples I-V. The minimum line width and line space of the mask were 100 μm, respectively, and are equivalent to 3–4 lines between pins. After both sides were exposed for about 5 minutes, using trichloroethylene, the unexposed portion was developed and removed. Then, using an electroless Ni-P plating both, Ni-P plating in about 1 μm was made. Then, after washed in washing, by immersing in electroless Cu plating solution for 15 minutes, the substrate was plated with Cu to a thickness of 1 μm. After washing in water, it was treated at 150° C. for 20 min. to improve adhesion strength and alkali-resistance of the resist and adhesion strength of the plated film. After activating in dilute hydrochloric acid, the substrate was washed in water and then, immersed in high speed thickneing electroless Cu plating solution (made by World Metal Co., Ltd.) for 15 hours for copper plating to a thickness of about 30 μm. Peeling strength of the copper pattern was 2.0–2.5 kg/cm. Characteristics of the substrate thus obtained were tested according to JIS C-5012 and C-6484 and satisfied all the specified standards. An example of test results are shown in Table-II.

As is evident from Table-I and Table-II, the cured composition of this invention has excellent characteristics as an additive plating permanent resist.

TABLE II

| Testing Item | Example No. Example VI Photo-Curable resin composition (C-4) |
|---|---|
| Appearance of Permanent resist | good |
| Resolving power (mentioned above) | 100 μm ± 10 μm |
| Solder flow (Note-7) | none abnormality |
| Coefficient of Variation of Throughhole resistance (Note-8) | 5% or less |
| Insulation resistance   Ordinary state | $10^{13}$ Ω or more |
| Insulation resistance   After of Damp heat cycle test (Note-9) | $10^{10}$ Ω or more |

Note-7: immersed in the solder flow at 260° C. for 180 seconds.
Note-8: JIS C 5012, change rate at 100 times of thermal shock from 260° C. to 20° C.
Note-9: JIS C 5024.

COMPARATIVE EXAMPLE I

In example VI, a photosensitive heat-resisting dry film (made Du Pont Co., trade name: VACREL) was laminated and used for photo-curable resin composition (C-4) of this invention. The test results, on a fine pattern below 130 μm, the dry film as a plated resist was separated during the developing process.

COMPARATIVE EXAMPLE II

In example VI, a negative type photo-resist (cyclized rubber resin type) available in the market was used instead of photo-curable resin composition (C-4) of this invention and coated to a thickness of 30 μm and then UV exposure was made to the sample, but the coated film interior near the substrate was not cured.

What is claimed is:

1. A photo-curable resin composition for a permanent resist material which is used in an electroless plating process, said photoc-curable resin composition consisting essentially of a urethane-acrylate resin combined with from 0.05 to 10% by weight, based on the weight of the urethane-acrylate resin, of a photo-polymerization initiator, said urethaneacrylate resin being obtained by a process comprising: reacting component-A, with component-B; said component-A consisting of polyisocyanates obtained through reacting at least 0.8 to not more than 1.2 mol of "urethane prepolymer (a)" as hereinafter defined, with 1.0 equivalent of hydroxy group of "polybutadienepolyols or a mixture thereof with organic hydroxy compounds (b)" as hereinafter defined; said component-B being acrylate or methacrylate having hydroxyl group in the molecule thereof; said "urethane prepolymers (a)" are obtained by reacting from at least 0.8 to not more than 1.2 moles of diisocyanate compounds with a 1.0 equivalent of active hydrogen provided by at least one multi-functional compound having active hydrogen, to thereby obtain a urethane prepolymer, said at least one multi-functional compound being selected from the group consisting of glycerin, 1,2,6-hexanetriol, 1,1,1-trimethylol propane, 1,1,1-trimethylolethane, triethanolamine, triisopropanolamine, pentaerythritol and mixtures thereof, and said diisocyanate compounds being selected from the group consisting of aliphatic diisocyanates, aromatic diisocyanates and alicyclic diisocyanates; and reacting from at least 0.8 to not more than 1.2 moles of said urethane prepolymer with a 1.0 equivalent of hydroxyl group provided by at least one polybutadienepolyol or a mixture thereof with up to 40% by weight, based on the weight of said mixture, of at least one organic hydroxy compound, with the proviso that no less than the equivalent moles of urethane prepolymer be reacted with the hydroxyl group, to thereby obtain a polyisocyanate, terminated chain extended prepolymer said polybutadienepolyol having a number average molecular weight of from 500 to 5,000, a 1,2-bond in the range of 50% or more of the butadiene unit in the polymer chain, and hydroxy groups at both ends of the polymer chain, said at least one organic hydroxy compound having two or more hydroxyl groups in each molecule thereof and being selected from the group consisting of polyesterpolyols, polyetherpolyols and polyacrylpolyols; and reacting from 0.8 to 1.5 equivalents of hydroxyl group provided by an acrylate or a methacrylate having at least one hydroxyl group in the molecule thereof, with a 1.0 equivalent of isocyanate group in said polyisocyanates, to thereby obtain said urethane-acrylate resin.

2. A permanent resist material which includes a photo-curable resin composition and which is used for making plating resist patterns by the contact-photoimaging process in the electroless plating process for manufacturing printed circuit boards, said permanent resist material having, in use and after curing, excellent solder-thermal resistance and excellent plating-solution resistance, and being tack-free, said photo-curable resin composition consisting essentially of a urethane-acrylate resin combined with from 0.05 to 10% by weight, based on the weight of the urethane-acrylate resin of a photopolymerization initiator, said urethane-acrylate resin being obtained by a process comprising:

reacting from at least 0.8 to not more than 1.2 moles of a diisocyanate compound with a 1.0 equivalent of active hydrogen provided by at least one multi-functional compound having active hydrogen, to thereby obtain a urethane prepolymer, said multi-functional compounds being selected from the group consisting of glycerin, 1,2,6-hexanetriol, 1,1,1-trimethylolpropane, 1,1,1-trimethylolethane, triethanolamine, triisopropanolamine, pentaerythritol and mixture thereof, and said diisocyanate compounds being selected from the group consisting of aliphatic diisocyanates, aromatic diisocyanates and alicyclic diisocyanates; and reacting from at least 0.8 to not more than 1.2 moles of said urethane prepolymer with a 1.0 equivalent of hydroxyl group with the proviso that no less than the equivalent moles of urethane prepolymer be reacted with hydroxy group, said hydroxy group being provided by at least one polybutadienepolyol or a mixture thereof with up to 40% by weight, based on the weight of said mixture, of at least one organic hydroxy compounds, said polybutadienepolyol having a number average molecular weight of from 500 to 5,000, a 1,2-bond in the range of 50% or more of the butadiene unit in the polymer chain, and hydroxy groups at both ends of the polymer chain, said at least one organic hydroxy compound having two or more hydroxyl groups in each molecule thereof and being selected from the group consisting of polyesterpolyols, polyetherpolyols, and polyacrylpolyols; and reacting from 0.8 to 1.5 equivalents of hydroxyl group provided by an acrylate monomer or a methacrylate monomer having at least one hydroxyl group in the molecule thereof, with a 1.0 equivalent of isocyanate group in said polyisocyanate, to thereby obtain said urethane-acrylate resin.

* * * * *